US007962835B2

(12) United States Patent
Sung et al.

(10) Patent No.: US 7,962,835 B2
(45) Date of Patent: Jun. 14, 2011

(54) METHOD AND APPARATUS TO UPDATE PARAMETER OF ERROR FRAME

(75) Inventors: Ho-sang Sung, Yongin-si (KR); Kang-eun Lee, Gungneung-si (KR); Eun-mi Oh, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 592 days.

(21) Appl. No.: 11/858,236

(22) Filed: Sep. 20, 2007

(65) Prior Publication Data

US 2008/0195910 A1 Aug. 14, 2008

(30) Foreign Application Priority Data

Feb. 10, 2007 (KR) ........................ 10-2007-0014098

(51) Int. Cl.
*H03M 13/00* (2006.01)

(52) U.S. Cl. ........ 714/776; 714/755; 714/781; 714/799; 704/220; 704/223

(58) Field of Classification Search .................. 714/747, 714/755, 776, 781, 799; 704/220, 223
See application file for complete search history.

(56) References Cited

U.S. PATENT DOCUMENTS

| | | | | |
|---|---|---|---|---|
| 5,596,678 | A * | 1/1997 | Wigren et al. | 704/228 |
| 5,673,363 | A | 9/1997 | Jeon et al. | |
| 5,907,822 | A * | 5/1999 | Prieto, Jr. | 704/202 |
| 6,968,309 | B1 * | 11/2005 | Makinen et al. | 704/219 |
| 7,031,926 | B2 * | 4/2006 | Makinen et al. | 704/500 |
| 7,529,673 | B2 * | 5/2009 | Makinen et al. | 704/265 |
| 7,587,315 | B2 * | 9/2009 | Unno | 704/223 |
| 7,590,525 | B2 * | 9/2009 | Chen | 704/211 |
| 2004/0098257 | A1 | 5/2004 | Katsuya | |
| 2005/0182996 | A1 | 8/2005 | Bruhn | |

OTHER PUBLICATIONS

International Search Report dated May 15, 2008 issued in PCT/KR2008/000561.

* cited by examiner

*Primary Examiner* — Esaw T Abraham
(74) *Attorney, Agent, or Firm* — Stanzione & Kim, LLP

(57) ABSTRACT

In a method and apparatus to conceal an error in an audio signal, when the current frame has no error and a past frame input prior to the current frame has an error, a parameter for the past frame is generated using a parameter for the current frame and a parameter of a frame out of frames input prior to the past frame and a previously stored parameter is updated with the generated parameter, thereby concealing an error of an audio signal without additional delay and preventing degradation in sound quality in a frame that is input after a frame having an error.

13 Claims, 5 Drawing Sheets

METHOD AND APPARATUS TO UPDATE PARAMETER OF ERROR FRAME

CROSS-REFERENCE TO RELATED APPLICATIONS

This application claims the benefit of Korean Patent Application No. 10-2007-0014098, filed on Feb. 10, 2007, in the Korean Intellectual Property Office, the disclosure of which is incorporated herein in its entirety by reference.

BACKGROUND OF THE INVENTION

1. Field of the Invention

The present general inventive concept relates to a method and apparatus to conceal an error of an audio signal, and more particularly, to a method and apparatus to conceal an error included in an audio signal by generating a parameter of a frame having an error, i.e., an error frame, in a predetermined way.

2. Description of the Related Art

An error such as a packet error or a bit error may occur during transmission of an audio signal over a wired or wireless network due to various network conditions. Without proper processing of the error, annoying distortion may occur, resulting in degradation of sound quality.

In order to conceal the error, a sender-based scheme that conceals the error in an encoder and a receiver-based scheme that conceals the error in a decoder have conventionally been used. The receiver-based scheme can be divided into a scheme using extrapolation and a scheme using interpolation.

The receiver-based scheme using the extrapolation conceals an error of a current frame using only parameter information of past frames having no error. Although this scheme has no additional delay because it uses only parameter information of past frames, it exhibits lower sound quality than when the receiver-based scheme using interpolation is used.

The receiver-based scheme using the interpolation conceals an error of the current frame using parameter information of past frames having no error and parameter information of future frames having no error. This scheme exhibits higher performance than the scheme using extrapolation, due to a large mount of information when there is no additional information. However, according to this scheme, a time delay occurs until a frame having no error is input.

SUMMARY OF THE INVENTION

The present general inventive concept provides a method and apparatus to update a parameter of a past frame having an error by generating a parameter for the past frame using a parameter of a current frame having no error and a parameter of a frame having no error out of frames input prior to the past frame.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing a method of updating a parameter of an error frame. The method includes determining whether a current frame or a past frame that is input prior to the current frame has an error, generating a parameter for the past frame using a parameter for the current frame and a parameter of a frame having no error out of frames that are input prior to the past frame if it is determined that the current frame has no error and the past frame has an error, and updating a parameter of the past frame with the generated parameter.

The foregoing and/or other aspects and utilities of the present general inventive concept may also be achieved by providing a method of updating a parameter of an error frame. The method includes determining whether a current frame or a past frame that is input prior to the current frame has an error, generating and storing a parameter for the current frame using at least one parameter of at least one frame having no error out of past frames if it is determined that the current frame has an error, generating a parameter for the past frame using the parameter for the current frame and a parameter of a frame having no error out of frames input prior to the past frame if it is determined that the current frame has no error and the past frame has an error, and updating the parameter for the past frame with the generated parameter and storing the updated parameter.

The foregoing and/or other aspects and utilities of the present general inventive concept may also be achieved by providing a method of decoding an audio signal. The method includes determining whether a current frame or a past frame that is input prior to the current frame has an error, generating and storing a parameter for the current frame using at least one parameter of at least one frame having no error out of past frames if it is determined that the current frame has an error, decoding the current frame using the generated parameter for the current frame, generating a parameter for the past frame using the parameter for the current frame and a parameter of a frame having no error out of frames input prior to the past frame if it is determined that the current frame has no error and the past frame has an error, updating the parameter for the past frame with the generated parameter, and decoding the current frame using the updated parameter.

The foregoing and/or other aspects and utilities of the present general inventive concept may also be achieved by providing an apparatus for updating a parameter of an error frame. The apparatus includes an error frame detection unit determining whether a current frame or a past frame that is input prior to the current frame has an error, a first parameter generation unit generating a parameter for the past frame using a parameter for the current frame and a parameter of a frame having no error out of frames that are input prior to the past frame if it is determined that the current frame has no error and the past frame has an error, and a parameter update unit updating a parameter of the past frame with the generated parameter.

The foregoing and/or other aspects and utilities of the present general inventive concept may also be achieved by providing an apparatus for updating a parameter of an error frame. The apparatus includes an error frame detection unit to determine whether a current frame or a past frame that is input prior to the current frame has an error, a first parameter generation unit to generate and storing a parameter for the current frame using at least one parameter of at least one frame having no error out of past frames, if it is determined that the current frame has an error, a second parameter generation unit to generate a parameter for the past frame using the parameter for the current frame and a parameter of a frame having no error out of frames input prior to the past frame, if it is determined that the current frame has no error and the past frame has an error, a parameter storage unit to store the generated parameter, and a parameter update unit to update the parameter for the past frame with the generated parameter and storing the updated parameter.

The foregoing and/or other aspects and utilities of the present general inventive concept may also be achieved by providing an apparatus for decoding an audio signal. The apparatus includes an error frame detection unit to determine whether a current frame or a past frame that is input prior to the current frame has an error, a first parameter generation unit to generate and store a parameter for the current frame using at least one parameter of at least one frame having no error out of past frames, if it is determined that the current frame has an error, a second parameter generation unit to generate a parameter for the past frame using the parameter for the current frame and a parameter of a frame having no error out of frames input prior to the past frame, if it is determined that the current frame has no error and the past frame has an error, a parameter storage unit storing the generated parameter, a parameter update unit to update the parameter for the past frame with the generated parameter and to store the updated parameter, and a decoding unit to decode the current frame using the stored parameter.

The foregoing and/or other aspects and utilities of the present general inventive concept may also be achieved by providing a computer-readable medium having recorded thereon a program for executing a method of updating a parameter of an error frame. The method includes determining whether a current frame or a past frame that is input prior to the current frame has an error, generating a parameter for the past frame using a parameter for the current frame and a parameter of a frame having no error out of frames that are input prior to the past frame if it is determined that the current frame has no error and the past frame has an error, and updating a parameter of the past frame with the generated parameter.

The foregoing and/or other aspects and utilities of the present general inventive concept may also be achieved by providing a computer-readable medium having recorded thereon a program for executing a method of updating a parameter of an error frame. The method includes determining whether a current frame or a past frame that is input prior to the current frame has an error, generating and storing a parameter for the current frame using at least one parameter of at least one frame having no error out of past frames if it is determined that the current frame has an error, generating a parameter for the past frame using the parameter for the current frame and a parameter of a frame having no error out of frames input prior to the past frame if it is determined that the current frame has no error and the past frame has an error, and updating the parameter for the past frame with the generated parameter and storing the updated parameter.

The foregoing and/or other aspects and utilities of the present general inventive concept may also be achieved by providing a computer-readable medium having recorded thereon a program for executing a method of decoding an audio signal. The method includes determining whether a current frame or a past frame that is input prior to the current frame has an error, generating and storing a parameter for the current frame using at least one parameter of at least one frame having no error out of past frames if it is determined that the current frame has an error, decoding the current frame using the generated parameter for the current frame, generating a parameter for the past frame using the parameter for the current frame and a parameter of a frame having no error out of frames input prior to the past frame if it is determined that the current frame has no error and the past frame has an error, updating the parameter for the past frame with the generated parameter, and decoding the current frame using the updated parameter.

The foregoing and/or other aspects and utilities of the present general inventive concept may also be achieved by providing a method of processing an audio signal in an encoding and/or decoding apparatus, the method including decoding a frame having an error without updating a parameter of the frame corresponding to the error, and updating the parameter of the frame using a next frame having no error when the next frame having no error is processed.

The foregoing and/or other aspects and utilities of the present general inventive concept may also be achieved by providing an apparatus to process an audio signal in an encoding and/or decoding apparatus, including a decoding unit to decode a frame having an error without updating a parameter of the frame corresponding to the error, and a parameter update unit to update the parameter of the frame using a next frame having no error when the next frame having no error is processed The foregoing and/or other aspects and utilities of the present general inventive concept may also be achieved by providing a computer readable medium to contain computer readable codes as a program to execute a method of processing an audio signal in an encoding and/or decoding apparatus, the method including decoding a frame having an error without updating a parameter of the frame corresponding to the error, and updating the parameter of the frame using a next frame having no error when the next frame having no error is processed

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1A:
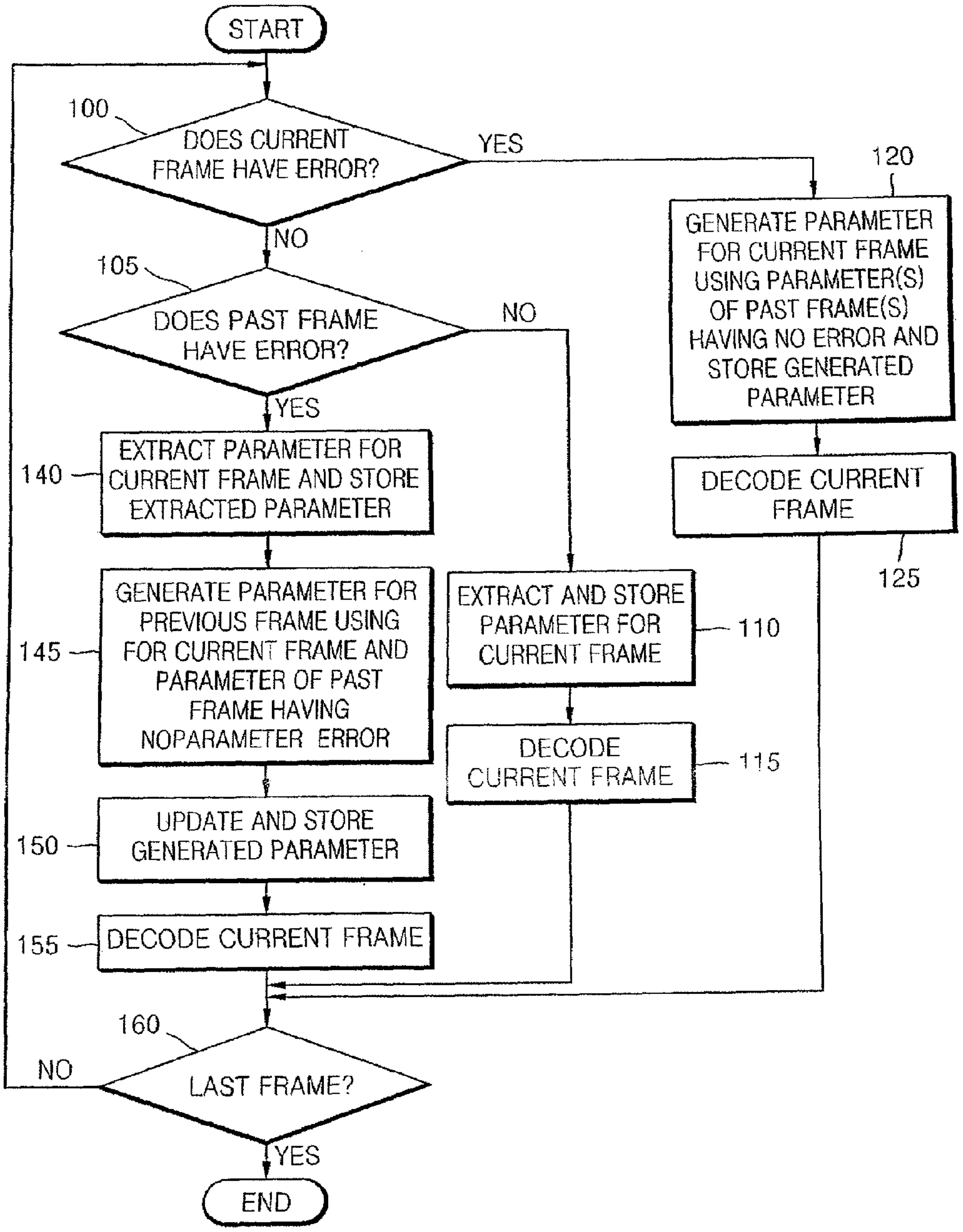
FIG. 1A is a flowchart illustrating a method of decoding an audio signal according to an exemplary embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

FIG. 1A is a flowchart of a method of decoding an audio signal in an encoding and/or decoding apparatus according to an exemplary embodiment of the present general inventive concept. The encoding and/or decoding apparatus may have an encoder and/or a decoder to process the audio signal, for example, encode and/or decode the audio signal.

In operation 100, it is determined whether a current frame in an audio signal has an error. The audio signal may be a speech signal, a music signal, or a combination of the speech signal and the music signal. Such a determination can be made in the following three ways.

The first way is to make the determination by receiving information indicating whether the current frame has an error, such as cyclic redundancy checking (CRC) information, from a system. The system may be a processor to process the audio signal and/or the encoder/decoder to encode or decode the audio signal.

The second way is to make the determination by comparing a length of a bitstream received from an encoder with a length of a decoded bitstream. When the current frame has an error, an error occurs between the length of the decoded bitstream and the length of the bitstream received from the encoder. However, for the current frame having no error, a bitstream having the same length as the bitstream received from the encoder is used for decoding. Thus, when the length of the bitstream received from the encoder is the same as that of the decoded bitstream, it is determined that a bitstream of the current frame has no error. When the length of the bitstream received from the encoder is different from that of the decoded bitstream, it is determined that the bitstream of the current frame has an error.

The third way is to make the determination by comparing the number of bits of a unit frame included in a header of a bitstream with the number of bits of a bitstream received from a decoder. For example, in a case of bit sliced arithmetic coding (BSAC), if a difference between frame length information indicating the length of a unit frame included in a header and the number of bits of a bitstream received from a decoder exceeds a predetermined threshold, it is determined that the current frame has an error.

If it is determined that the current frame has no error in operation 100, it is determined whether a past frame that is input prior to the current frame has an error in operation 105. The determination in operation 105 may be made in the same ways as used in operation 100.

If it is determined that the past frame has no error in operation 105, a parameter of the current frame is extracted from a bitstream that is demultiplexed by a decoding end (or a decoding processor or unit) of the encoding and/or decoding apparatus, and is stored in a storage medium such as a buffer of the encoding and/or decoding apparatus, in operation 110.

A synthetic parameter is generated using the parameter extracted in operation 110 and a parameter (or parameters) of a past frame (or past frames) stored in the storage medium and synthesis or reconstruction is performed by a synthesis filter of the encoding and/or decoding apparatus, thereby decoding the current frame using the synthetic parameter in operation 115.

Figure 3A:
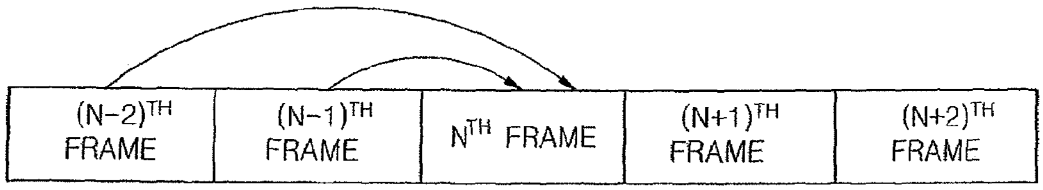
FIG. 3A is a conceptual view illustrating generation of a parameter using extrapolation.

If it is determined that the current frame has an error in operation 100, a parameter for the current frame is generated using a parameter (or parameters) of a frame (or frames) having no error from among past frames that are input prior to the current frame in operation 120. In order to generate the parameter for the current frame having an error in operation 120, extrapolation can be used as illustrated in FIG. 3A. The parameter for the current frame can be generated by performing the extrapolation using parameters of past frames without an error, for example, deduced codec parameters with respect to a past frame (or past frames). The deduced codec parameters may be a pitch delay, a pitch gain, and a linear prediction coding (LPC) coefficient with respect to a past frame (or past frames. For a music signal, a scale factor or sub-band energy may also be deduced as a codec parameter. For a speech signal, a codebook gain may also be deduced as a codec parameter.

The parameter generated in operation 120 is stored in the storage medium in order to be used to decode a future frame (or future frames) to be input after the current frame.

A synthetic parameter is generated using the parameter generated in operation 120 and a parameter (or parameters) of a past frame (or past frames) stored in the storage medium and synthesis or reconstruction is performed by the synthetic filter, thereby decoding the current frame in operation 125.

If it is determined that the past frame has an error in operation 105, the parameter of the current frame is extracted from the bitstream demultiplexed by the decoding end or a decoding processor or unit) of the encoding and/or decoding apparatus, and is stored in the storage medium such as the buffer in operation 140.

Figure 3B:
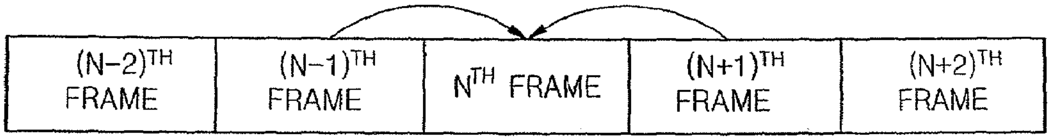
FIG. 3B is a conceptual view illustrating generation of a parameter using interpolation.

A parameter (or parameters) of a frame (or frames) having no error from among frames that are input prior to the past frame is (are) read from the storage medium. In operation 145, a parameter for the past frame is generated using the read parameter(s) and the parameter extracted in operation 140. In order to generate the parameter for the past frame in operation 145, interpolation can be used as illustrated in FIG. 3B. The parameter for the past frame can be generated by performing the interpolation using parameters of current frame and past frames without an error, for example, deduced codec parameters with respect to the past frame and the current frame. The deduced codec parameters may be pitch delays, pitch gains, and linear prediction coding (LPC) coefficients with respect to the past frame and the current frame. For a music signal, a scale factor or sub-band energy may also be deduced as a codec parameter. For a speech signal, a codebook gain may also be deduced as a codec parameter.

In operation 150, the parameter of the past frame with error is updated with the parameter generated in operation 145 and the updated parameter is stored in the storage medium.

In operation 120, the error of the current frame is concealed using only a parameter(s) of a past frame (or frames) because it is not necessary to wait for a frame (i.e., a next or future frame) having no error and thus the error of the current frame can be concealed using only the parameter(s) of the past frame (or frames) with no additional delay.

However, error concealment using only a parameter(s) of a past frame (or frames) may cause degradation in sound quality. As a result, a future frame that is input after the current frame is also affected, causing consecutive degradation in sound quality. To solve this problem, an error is concealed using a parameter of a future frame having no error as well as the parameter of the past frame and the previously stored parameter of the current frame is updated and stored in operation 145, thereby improving sound quality.

Thus, the error of the current frame can be primarily concealed using only the parameter of the past frame in order to avoid additional delay, and the error of the current frame can be further concealed using the parameter of the future frame as well as the parameter of the past frame and the previously stored parameter of the current frame is updated and stored thereby allowing the future frame to be accurately decoded.

In operation 155, a synthetic parameter is generated using the parameter updated in operation 150, the parameter(s) of the past frame(s) previously stored in the storage medium, and the parameter extracted in operation 140, and synthesis or reconstruction is performed by the synthesis filter, thereby decoding the current frame.

In operation 160, it is determined whether there is another frame to be decoded after completion of one of operations 115, 125, and 155.

If it is determined that there is another frame to be decoded in operation 160, operations 100 through 160 are repeated for the frame to be decoded.

Figure 1B:
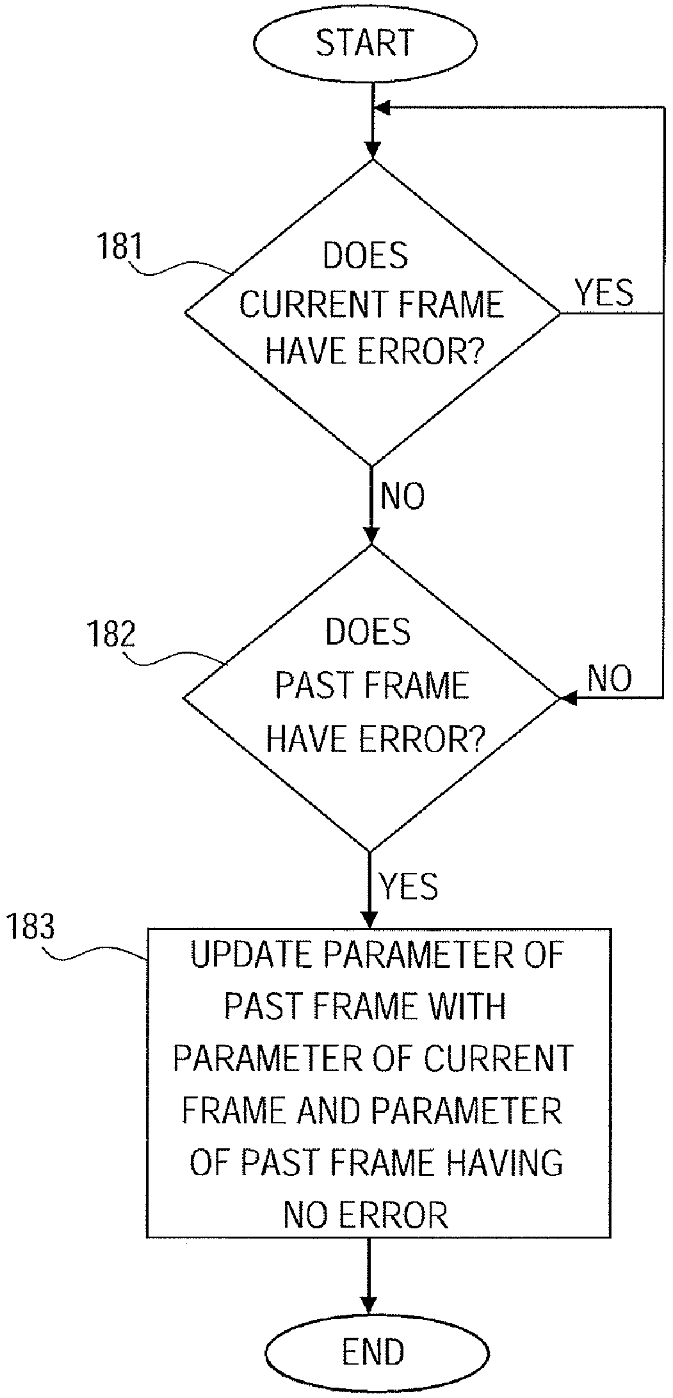
FIG. 1B is a flow chart illustrating a method of updating a parameter of a frame in processing an audio signal in an encoding and/or decoding apparatus according to an exemplary embodiment of the present general inventive concept.

FIG. 1B is a flow chart illustrating a method of updating a parameter of a frame in processing an audio signal in an encoding and/or decoding apparatus according to an exemplary embodiment of the present general inventive concept. In operation 181, it is determined whether a current frame has an error, and in operation 182, it is also determined whether a past frame has an error. A parameter of the past frame is updated using a parameter of the current frame and a parameter of another past frame having no error, according to the determinations of operations 181 and 182. The past frame may be a frame immediately before the current frame, and the another past frame may be a frame input before the current frame.

Figure 1C:
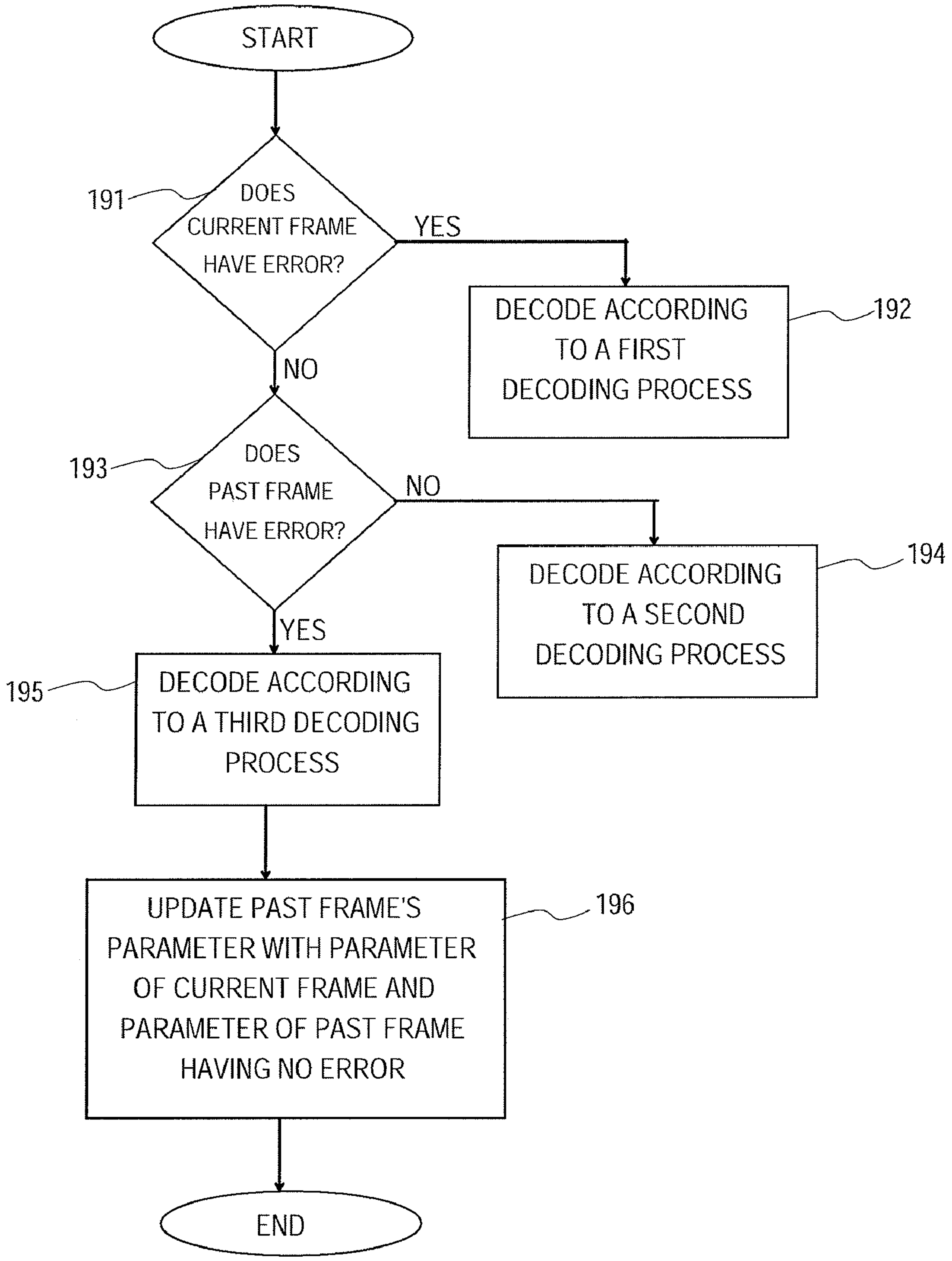
FIG. 1C is a flow chart illustrating a method of decoding a frame and updating a parameter of the frame in processing an audio signal in an encoding and/or decoding apparatus according to an exemplary embodiment of the present general inventive concept.

FIG. 1C is a flow chart illustrating a method of decoding a frame and updating a parameter of the frame in processing an audio signal in an encoding and/or decoding apparatus according to an exemplary embodiment of the present general inventive concept. In operation 181, it is determined whether a current frame has an error, and the audio signal is decoded according to a first decoding process in operation 192. The first process may be a process of decoding the current frame of the audio signal using past frames having no error. In operation 193, it is determined whether a past frame has an error, and the audio signal is decoded according to a second decoding process in operation 194. The second decoding process may be a process of decoding the current frame using a parameter of the current frame. In operation 105, the audio signal is decoded according to a third decoding process in operation 195. The third decoding process may be a process of decoding the current frame using a parameter of the current frame and a parameter of another past frame having no error. And then, a parameter of the past frame having the error is updated using the parameter of the current frame and the parameter of the another past frame having no error in operation 196. Accordingly, when the past frame has an error, the past frame is decoded without updating the parameter of the past frame, and then the parameter of the past frame is updated after a next frame, i.e., the current frame having no error, is received or processed. If the next frame (current frame) has an error, the next frame (current frame) can be decoded using parameters of past frames having no error without conceal the error, and then the parameter of the past frame and/or the parameter of the next frame (current frame) is updated when another next frame (another current frame or future frame) having no error is received.

Figure 2:
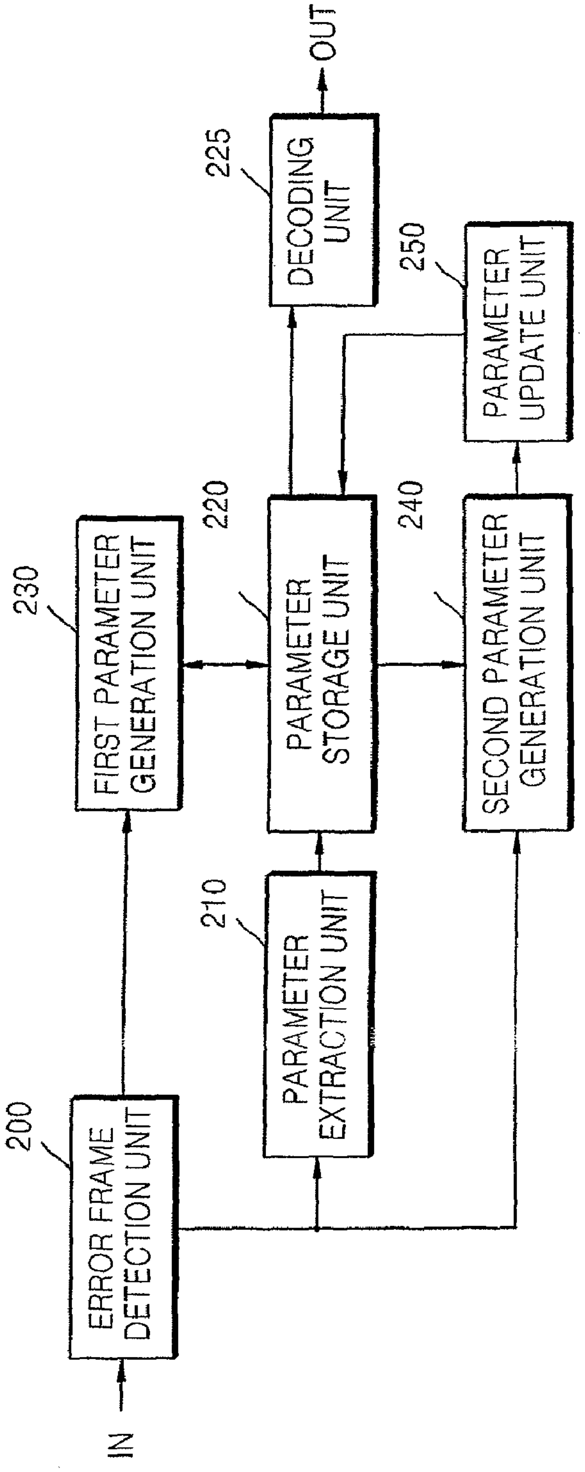
FIG. 2 is a block diagram of an apparatus to decode an audio signal according to an exemplary embodiment of the present general inventive concept.

FIG. 2 is a block diagram of an apparatus to decode an audio signal in an encoding and/or decoding apparatus according to an exemplary embodiment of the present general inventive concept. The apparatus includes an error frame detection unit 200, a parameter extraction unit 210, a parameter storage unit 220, a decoding unit 225, a first parameter generation unit 230, a second parameter generation unit 240, and a parameter update unit 250. It is possible that method of FIGS. 1A, 1B, and 1C can be performed in the apparatus of FIG. 2

The error frame detection unit 200 determines whether a current frame in an audio signal such as a speech signal or a music signal has an error. Such a determination can be made in the following three ways.

The first way is to make the determination by receiving information indicating whether the current frame has an error, such as cyclic redundancy checking (CRC) information, from a system.

The second way is to make the determination by comparing the length of a bitstream received from an encoder with the length of a decoded bitstream. When the current frame has an error, an error occurs between the length of the decoded bitstream and the length of the bitstream received from the encoder. However, for the current frame having no error, a bitstream having the same length as the bitstream received from the encoder is used for decoding. Thus, when the length of the bitstream received from the encoder is the same as that of the decoded bitstream, it is determined that a bitstream of the current frame has no error. When the length of the bitstream received from the encoder is different from that of the decoded bitstream, it is determined that the bitstream of the current frame has an error.

The third way is to make the determination by comparing the number of bits of a unit frame included in a header of a bitstream with the number of bits of a bitstream received from a decoder. For example, in a case of bit sliced arithmetic coding (BSAC), if a difference between frame length information indicating the length of a unit frame included in a header and the number of bits of a bitstream received from a decoder exceeds a predetermined threshold, it is determined that the current frame has an error.

If the error frame detection unit 200 determines that the current frame has no error, it determines whether a past frame that is input prior to the current frame has an error.

If the error frame detection unit 200 determines that the past frame has no error, the parameter extraction unit 210 extracts a parameter of the current frame from a bitstream demultiplexed by a decoding end.

The parameter storage unit 220 stores the parameter of the current frame, which is extracted by the parameter extraction unit 210, in a storage medium such as a buffer of the encoding and/or decoding apparatus.

The decoding unit 225 generates a synthetic parameter using the parameter of the current frame, which is extracted by the parameter extraction unit 210 and stored in the parameter storage unit 220, and a parameter (or parameters) of a past frame (or past frames) previously stored in the storage medium and performs synthesis or reconstruction through a synthesis filter, thereby decoding the current frame using the synthetic parameter.

If the error frame detection unit 200 determines that the current frame has an error, the first parameter generation unit 230 generates the parameter for the current frame using a parameter (or parameters) of a frame (or frames) having no error from among past frames that are input prior to the current frame. The first parameter generation unit 230 may generate the parameter for the current frame having an error using extrapolation as illustrated in FIG. 3A. In other words, the first parameter generation unit 230 may generate the parameter for the current frame by performing extrapolation using deduced codec parameters such as such as a pitch delay, a pitch gain, and a linear prediction coding (LPC) coefficient with respect to a past frame (or past frames). For a music signal, a scale factor or sub-band energy may also be deduced as a codec parameter. For a speech signal, a codebook gain may also be deduced as a codec parameter.

The parameter storage unit 220 stores the parameter generated by the first parameter generation unit 230 for use in decoding a future frame (or future frames) to be input after the current frame.

The decoding unit 225 generates a synthetic parameter using the parameter that is generated by the first parameter generation unit 230 and stored in the parameter storage unit 220 and a parameter (or parameters) of a past frame (or past frames) stored in the storage medium and performs synthesis or reconstruction using a synthetic filter, thereby decoding the current frame.

If the error frame detection unit 200 determines that the past frame has an error, the parameter extraction unit 210 extracts the parameter of the current frame from a bitstream demultiplexed by the decoding end (decoding process or unit) and the parameter storage unit 220 stores the parameter extracted by the parameter extraction unit 210.

The second parameter generation unit 240 reads a parameter (or parameters) of a frame (or frames) having no error from among frames that are input prior to the past frame from the storage medium. The second parameter generation unit 240 generates a parameter for the past frame using the read parameter(s) and the parameter extracted by the parameter extraction unit 210.

The second parameter generation unit 240 may generate the parameter for the past frame using interpolation as illustrated in FIG. 3B. In other words, the second parameter generation unit 240 may generate the parameter for the past frame by performing interpolation using deduced codec parameters such as pitch delays, pitch gains, and LPC coefficients with respect to the past frame and the current frame. For a music signal, a scale factor or sub-band energy may also be deduced as a codec parameter. For a speech signal, a codebook gain may also be deduced as a codec parameter.

The parameter update unit 250 updates the parameter of the past frame with the parameter generated by the second parameter generation unit 240 and stores the updated parameter.

The first parameter generation unit 230 conceals the error of the current frame using only a parameter(s) of a past frame (or frames) because it is not necessary to wait for a frame having no error and thus the error of the current frame can be concealed using only the parameter(s) of the past frame (or frames) with no additional delay.

However, error concealment using only a parameter(s) of a past frame (or frames) may cause degradation in sound quality. As a result, a future frame that is input after the current frame is also affected, causing consecutive degradation in sound quality. In order to solve the problem, the second parameter generation unit 240 conceals an error using a parameter of a future frame having no error as well as the parameter of the past frame and updates and stores the previously stored parameter of the current frame, thereby improving sound quality.

Thus, the error of the current frame can be primarily concealed using only the parameter of the past frame in order to avoid additional delay, and the error of the current frame can be further concealed using the parameter of the future frame as well as the parameter of the past frame and the previously stored parameter of the current frame is updated and stored, thereby allowing the future frame to be accurately decoded.

The decoding unit 225 generates a synthetic parameter using the parameter updated by the parameter update unit 250, the parameter(s) of the past frame(s) previously stored in the parameter storage unit 220, and the parameter extracted by the parameter extraction unit 210 and performs synthesis or reconstruction using the synthesis filter, thereby decoding the current frame.

As described above, according to the present general inventive concept, when the current frame has no error and a past frame has an error, a parameter of the past frame is generated using only a parameter of the current frame and a parameter of a frame having no error from among frames input prior to the past frame, and a previously stored parameter is updated with the generated parameter.

Figure 4:
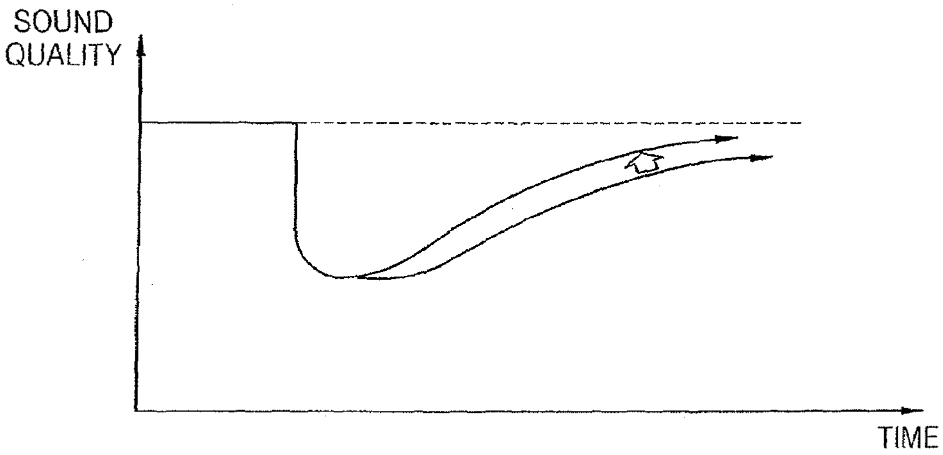
FIG. 4 is a graph illustrating effects that can be obtained by a method and apparatus to update a parameter of an error frame according to the present general inventive concept.

In this way, an error of an audio signal can be concealed without additional delay and degradation in sound quality can be prevented in a frame input after a frame having an error. By minimizing delay in a decoding end, additional time can be secured for an encoding end, thereby achieving an efficient codec structure. Moreover, as illustrated in FIG. 4, it is possible to minimize the influence of a frame having an error upon a frame input after the frame having an error.

The present general inventive concept can also be embodied as computer-readable codes on a computer-readable medium. The computer-readable medium can include a computer-readable recording medium and a computer-readable transmission medium. The computer-readable recording medium is any data storage device that can store data which can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network coupled computer systems so that the computer-readable code is stored and executed in a distributed fashion. The computer-readable transmission medium can transmit carrier waves or signals (e.g., wired or wireless data transmission through the Internet). Also, functional programs, codes, and code segments to accomplish the present general inventive concept can be easily construed by programmers skilled in the art to which the present general inventive concept pertains.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of updating a parameter of an error frame in an encoding and/or decoding apparatus, the method comprising:
- determining whether a current frame or a past frame that is input prior to the current frame has an error;
- if it is determined that the current frame has no error and the past frame has an error, generating a parameter for the past frame using a parameter for the current frame and a parameter of a frame having no error out of frames that are input prior to the past frame; and
- updating a parameter of the past frame with the generated parameter,
- wherein the method further comprises:
- generating the parameter for the current frame using at least one parameter of at least one frame having no error out of past frames if it is determined that the current frame has an error.

2. The method of claim 1, wherein the generating of the parameter for the past frame comprises generating the parameter for the past frame using interpolation.

3. The method of claim 1, wherein the generating of the parameter for the current frame comprises generating the parameter for the current frame using extrapolation.

4. The method of claim 1, further comprising:
- decoding the current frame or predetermined frames that are input after the current frame using the updated parameter.

5. The method of claim 1, further comprising:

decoding the current frame or predetermined frames that are input after the current frame using the generated parameter for the current frame.

6. The method of claim 1, the method further comprising:

if it is determined that the current frame has an error, generating and storing a parameter for the current frame using at least one parameter of at least one frame having no error out of past frames; and storing the updated parameter.

7. An apparatus to update a parameter of an error frame, the apparatus comprising:

an error frame detection unit to determine whether a current frame or a past frame that is input prior to the current frame has an error;

a first parameter generation unit to generate a parameter for the past frame using a parameter for the current frame and a parameter of a frame having no error out of frames that are input prior to the past frame if it is determined that the current frame has no error and the past frame has an error; and a parameter update unit to update a parameter of the past frame with the generated parameter, wherein the apparatus further comprises:

a second parameter generation unit generating the parameter for the current frame using at least one parameter of at least one frame having no error out of past frames if it is determined that the current frame has an error.

8. The apparatus of claim 7, wherein the first parameter generation unit generates the parameter for the past frame using interpolation.

9. The apparatus of claim 7, wherein the second parameter generation unit generates the parameter for the current frame using extrapolation.

10. The apparatus of claim 7, further comprising:

a first decoding unit decoding the current frame or predetermined frames that are input after the current frame using the updated parameter.

11. The apparatus of claim 7, further comprising a second decoding unit decoding the current frame or predetermined frames that are input after the current frame using the generated parameter for the current frame.

12. The apparatus of claim 7, the apparatus further comprising:

a second parameter generation unit to generate a parameter for the past frame using the parameter for the current frame and a parameter of a frame having no error out of frames input prior to the past frame, if it is determined that the current frame has no error and the past frame has an error; and a parameter storage unit storing the generated parameter, wherein the parameter update unit updates the parameter for the past frame with the generated parameter and stores the updated parameter.

13. A non-transitory computer-readable medium having recorded thereon a program for executing a method of updating a parameter of an error frame, the method comprising:

determining whether a current frame or a past frame that is input prior to the current frame has an error;

if it is determined that the current frame has no error and the past frame has an error, generating a parameter for the past frame using a parameter for the current frame and a parameter of a frame having no error out of frames that are input prior to the past frame; and updating a parameter of the past frame with the generated parameter wherein the method further comprises:

if it is determined that the current frame has an error, generating and storing a parameter for the current frame using at least one parameter of at least one frame having no error of past frames; and storing the updated parameter.

* * * * *